(12) United States Patent
Stevens

(10) Patent No.: US 6,611,150 B1
(45) Date of Patent: Aug. 26, 2003

(54) LEAKAGE DETECTOR FOR USE IN COMBINATION WITH A SIGNAL LEVEL METER

(75) Inventor: William D. Stevens, Toronto (CA)

(73) Assignee: Sadelco, Inc., Englewood, NJ (US)

( * ) Notice: Subject to any disclaimer, the term of this patent is extended or adjusted under 35 U.S.C. 154(b) by 0 days.

(21) Appl. No.: 09/282,825

(22) Filed: Mar. 31, 1999

(51) Int. Cl.[7] ........................ G01R 29/26; G01R 27/02; G01R 27/28
(52) U.S. Cl. ......................... 324/613; 324/95; 324/627
(58) Field of Search .................. 324/613, 614, 324/616, 620, 627, 628, 95; 381/13, 104; 348/180

(56) References Cited

U.S. PATENT DOCUMENTS

| | | |
|---|---|---|
| 3,372,339 A | 3/1968 | Harrison et al. |
| 3,414,821 A | 12/1968 | Bickers et al. |
| 3,586,973 A | 6/1971 | Lawton |
| 3,632,888 A | 1/1972 | Glaser |
| 3,753,169 A | 8/1973 | Condon |
| 3,758,884 A | 9/1973 | Bahler et al. |
| 3,783,380 A | 1/1974 | Bradley |
| 3,908,165 A | 9/1975 | Cauldwell |
| 3,995,105 A | 11/1976 | Krivosheev et al. |
| 4,000,369 A | 12/1976 | Paul, Jr. et al. |
| 4,023,104 A | 5/1977 | Rheinfelder |
| 4,063,173 A | 12/1977 | Nelson et al. |
| 4,072,899 A | 2/1978 | Shimp |
| 4,152,669 A | 5/1979 | Igarashi |
| 4,198,604 A | 4/1980 | Holdaway |
| 4,237,486 A | 12/1980 | Shimp |
| 4,322,856 A | 3/1982 | Ohta et al. |
| 4,340,974 A | 7/1982 | Cooke et al. |
| 4,361,881 A | 11/1982 | Clemens |

(List continued on next page.)

OTHER PUBLICATIONS

Harry Sadel, "Testing for CLI with an SLM," *Communications Technology*, Jul., 1991, p. 24.
Wavetek specification sheet for CLM–100 Leakage Field Strength Meter, Jun., 1990 (2 pages).
Wavetek specification sheet for CLR–4 Leakage Detector/Locator, Aug., 1988 (2 pages).
Trilithic product announcement, Communications Technology, Jun. 1992, 1 page.
Trilithic Searcher Plus Operation & Application Manual, P/N 001–120–00, 1989, title page and pages 1–26.
ComSonics, Inc. product literature on Window™ LitePlus and Modularity, 1992, 8 pages.
ComSonics, Inc. product literature on Sniffer Jr. (2 pages)—undated.
Wavetek product literature on LineSAM II™, 1993, 4 pages.
CaLan™ product literature on Star Signal level Measurement System, Dec. 1, 1992, 5 pages.

(List continued on next page.)

*Primary Examiner*—Christine Oda
*Assistant Examiner*—James Kerveros
(74) *Attorney, Agent, or Firm*—Richard M. Goldberg

(57) ABSTRACT

A leakage detector includes a receiver front end having an input for connection with an antenna and a signal path including circuitry for passing a signal from the input without amplification; an IF stage connected with the receiver front end for producing an IF signal therefrom; a detector for producing an AM detected output signal in response to the IF signal; a leak processor for passing only a synchronizing signal of the AM detected output signal, along with harmonic frequencies of the synchronizing signal and DC signals, the synchronizing signal having a peak level, and the signal processor providing an output corresponding to the peak level of the synchronizing signal of the AM detected output signal; a display; and a processing unit connected with the leak processor and the display for displaying leakage data in response to the output signal from the leak processor.

40 Claims, 11 Drawing Sheets

U.S. PATENT DOCUMENTS

| | | |
|---|---|---|
| 4,395,777 A | 7/1983 | Oki et al. |
| 4,413,229 A | 11/1983 | Grant |
| 4,446,438 A | 5/1984 | Chang et al. |
| 4,491,968 A | 1/1985 | Shimp et al. |
| 4,512,035 A | 4/1985 | Victor et al. |
| 4,520,393 A | 5/1985 | Zwijsen et al. |
| 4,569,072 A | 2/1986 | von Roermund |
| 4,570,117 A | 2/1986 | Holt |
| 4,578,820 A | 3/1986 | Highton |
| 4,646,258 A | 2/1987 | Miodownik |
| 4,684,989 A | 8/1987 | Roder et al. |
| 4,685,065 A | 8/1987 | Braun et al. |
| 4,710,969 A | 12/1987 | Fluck, Jr. et al. |
| 5,057,848 A | 10/1991 | Rankin et al. |
| 5,241,388 A | 8/1993 | Schofield et al. |
| 5,291,285 A | 3/1994 | Yokoyama et al. |
| 5,294,937 A | 3/1994 | Ostteen et al. |
| 5,313,823 A | 5/1994 | Berkman et al. |
| 5,321,849 A | 6/1994 | Lemson |
| 5,337,251 A | 8/1994 | Pastor |
| 5,387,946 A | 2/1995 | Knee |
| 5,490,094 A | 2/1996 | Heimburger et al. |
| 5,493,210 A | 2/1996 | Orndorff et al. |
| 5,542,114 A | 7/1996 | Kojima et al. |
| 5,608,428 A | 3/1997 | Bush |
| 5,633,582 A | 5/1997 | Orndorff et al. |
| 5,680,420 A | 10/1997 | Reime |
| 5,777,662 A | 7/1998 | Zimmerman |
| 5,982,165 A * | 11/1999 | Bowyer et al. ............. 324/509 |

OTHER PUBLICATIONS

National Cable Television Association, "NCTA Recommended Practices for Measurements on Cable Television Systems," $2^{nd}$ ed., 1983 and 1989, 14 pages.

Archer S. Taylor, "Characterization of Cable TV Networks as the Transmission Media for Data," IEEE Journal on Selected Areas in Communications, vol. SAC–3, No. 2, Mar. 1985, pp. 255–265.

Martin J. Walker, "FCC Leakage Limits," Communications Technology, Jul. 1988, 1 page.

* cited by examiner

LEAKAGE DETECTOR FOR USE IN COMBINATION WITH A SIGNAL LEVEL METER

BACKGROUND OF THE INVENTION

The present invention relates generally to leakage detectors, and more particularly, is directed to a leakage detector which can be used in combination with a signal level meter.

The use of a signal level meter (SLM) to measure signal levels of a cable or CATV system, as well as leakage from such a system, is well known. For example, in the article "FCC Leakage Limits" in Communications Technology, July, 1988, page 38 by Martin J. Walker, it is stated that the FCC limits on leakage are 15 μV/m at 100 feet for frequencies up to and including 54 MHz or frequencies over 216 MHz, and 20 μV/m at 10 feet over 54 MHz up to and including 216 MHz. In this article, Mr. Walker states that most systems use a signal level meter calibrated in dBmV to measure leakage.

NCTA Recommended Practices for Measurements on Cable Television Systems, Second Edition, 1989, published by the National Cable Television Association (NCTA), Washington, D.C., pages I.J.1–I.J.10, deals with signal leakage systems which can be used to comply with FCC Rules and Regulations part 76, subpart K, as to the maximum leakage limits from a cable system. As stated at page I.J.6, most measurements of field strength are commonly made with a field strength meter which is, in fact, a selective voltmeter. However, as further discussed therein, most commercially available meters do not have the required sensitivity to measure 20 μV/m at channel 13, and therefore, measurements may have to be confined to either the low end of the VHF high band or by employing a preamplifier ahead of the field strength meter. At page I.J.8, there is also a teaching of decreasing the IF bandwidth of a spectrum analyzer so that less noise energy from external or man-made noise is admitted, whereby such external or man-made noise, for example, from an urban environment, does not obstruct or affect the measurement of leakage.

U.S. Pat. No. 5,493,210 to Orndorff et al, and U.S. Pat. No. 5,633,582 to Orndorff et al, which is a continuation of the former, the disclosures of which are both incorporated herein by reference, use the above teachings to provide a combined signal level meter and leakage detector. In these patents, a signal level meter is also used to detect leakage, and a common IF stage is provided for both leakage detection and the signal level meter operation. Specifically, the required sensitivity for leakage detection is provided in two ways. First, the IF stage includes two switchable IF filters, one having a bandwidth of 280 KHz for use in the signal level meter mode, and the other having a reduced bandwidth of 10 KHz for the leakage detection mode. Switching is controlled by a microcontroller. Second, a preamplifier is provided between the antenna which receives the leakage signal and the first mixer in the IF stage for the same. Since the mixer adds noise to the signal, the preamplifier amplifies the leakage signal before the noise is added by the mixer, thereby increasing the signal to noise ratio.

However, the system of these patents is relatively complicated, and requires two separate inputs, one for the antenna which is used in the leakage mode, and the other for the cable which is used in the signal level meter mode. As a result, two different receiver front ends are required, one being a wideband dual-conversion receiver front end connected to the cable input and the other being a single-conversion receiver front end connected to the antenna input. The outputs of the two receiver front ends are connected with two different inputs of the IF stage. This arrangement, however, makes the circuitry more complicated and costly.

For a video modulated carrier, the 100% carrier level corresponds to the vertical and horizontal sync peaks. The carrier level within the video portions is variable and depends on the picture information being transmitted. Therefore, the most accurate way to measure the level of the video modulated carrier for signal level meter and leakage detector applications is to determine the peak level at the horizontal or vertical sync peaks.

Further, since the leakage signal can be 10–20 dB below the level of the noise floor, the required measurement range for leakage measurements must extend to signals to about −55 dBmV or lower. As discussed above, the classic way around this problem is to use a narrower IF passband and to also increase the level of the leakage signal prior to adding noise by the receiver front end. This means that the signal level meter must use an IF bandwidth of 10–15 KHz to improve sensitivity for the leakage measurement. However, this has the drawback that the lowered bandwidth does not allow the peaks of the horizontal synchronizing signal to be used for processing, so that the speed of response to signal level changes is fundamentally limited to the detection and processing of peaks of the vertical synchronizing signal or to an average of the video signal. To use the peaks of the horizontal synchronizing signal, a wide IF bandwidth of, for example, 280 KHz must be used for leakage detection.

Also, the use of a narrower IF bandwidth requires greater tuning precision in the tuner and in the electronic tuning control.

In the former case, detection of the peaks of the vertical synchronizing signal will not give a sufficiently useful response for leak tracing because of the slowness of the system. In the latter case of detecting the average of the video signal, the measurement variation of the leakage signal is unrelated to the carrier level of the video signal, due to constant changes in the video signal. As a result, leakage detection is affected by the video signal itself, which can provide misleading results.

OBJECTS AND SUMMARY OF THE INVENTION

Accordingly, it is an object of the present invention to provide a leakage detector which can be used in combination with a signal level meter, that overcomes the problems with the aforementioned prior art.

It is another object of the present invention to provide a combination leakage detector and signal level meter that includes a single signal path, and thereby, common circuitry, for both signal level meter and leakage detection operations.

It is still another object of the present invention to provide a leakage detector which provides leakage signal processing circuitry after the IF stage and detector for use in leakage detection operations.

It is yet another object of the present invention to provide a leakage detector which uses filtering and noise power subtraction circuitry after the IF stage and detector for use in leakage detection.

It is a further object of the present invention to provide a leakage detector having a sufficiently fast response to signal level changes, in order to use the peaks of the horizontal synchronizing signal of the video signal to reduce noise in the leakage signal, and thereby easily trace leaks in a CATV system.

It is a still further object of the present invention to provide a leakage detector which uses a relatively wide IF bandwidth of 280 KHz for both the signal level meter mode and leakage detection mode.

It is a yet further object of the present invention to provide a leakage detector which can be used in combination with a signal level meter, and which is economical and easy to manufacture and use.

In accordance with an aspect of the present invention, a leakage detector includes a receiver front end having an input for connection with an antenna; an intermediate frequency (IF) stage connected with the receiver front end for producing an intermediate frequency signal; a detector having an input for producing an amplitude modulation (AM) detected output signal in response to the intermediate frequency signal; a leak processor operative in a leakage mode only when the antenna is connected with the receiver front end, the leak processor having an input connected to the detector for removing noise from the AM detected output signal which is above and below the frequency of a synchronizing signal of the AM detected output signal, and which is not in frequency coherence with the synchronizing signal of the AM detected output signal, the synchronizing signal having a peak level, and the signal processor providing an output signal corresponding to the peak level of the synchronizing signal of the AM detected output signal; a display; and a processing unit connected with the leak processor and the display for displaying leakage data in response to the output signal from the leak processor.

The leak processor includes a filter having an input connected with the detector for removing AC noise from the AM detected output signal which is not in frequency coherence with the synchronizing signal, and for producing a filtered AM detected output signal; a first peak detector having an input connected with the detector for receiving the AM detected output signal therefrom and producing a first peak detected output signal; a second peak detector having an input connected with the filter for receiving the filtered AM detected output signal therefrom and producing a second peak detected output signal; and a noise power subtraction circuit having inputs connected with the first and second peak detectors for subtracting a DC level equivalent to noise power from the filtered AM detected output signal in response to the first and second peak detected output signals, to provide the output signal corresponding to leakage.

The noise power subtraction circuit includes a first difference circuit having a first input connected with the first peak detector and a second input connected with the second peak detector, and which produces an output error signal in response to a difference between the first and second peak detected output signals; and a second difference circuit having a first input connected with the first difference circuit and a second input connected with the second peak detector, and which produces the output signal corresponding to leakage in response to a difference between the first and second peak detected output signals.

The leak processor further includes an equalization circuit connected between the filter and the second peak detector for compensating for a reduction in signal level of the filtered AM detected output signal from the filter. The synchronizing signal is a horizontal synchronizing signal, and the filter includes an N-path filter clocked at a multiple rate corresponding to a sweep rate of the horizontal synchronizing signal.

Further, the leak processor includes a gate circuit, along with a gate control circuit having an output connected with an input of the gate circuit, and which controls the gate circuit to pass the output signal corresponding to leakage to the processing unit only when the AM detected output signal includes a video modulated carrier component. The gate control circuit includes a filter which only passes that portion of the AM detected output signal at a frequency of the synchronizing signal; a detector having an input connected with the filter, and which detects the presence of an output signal from the filter to produce a control signal; and a gate drive circuit having an input connected with the detector and an output connected with the gate circuit, for controlling the gate circuit to pass the output signal corresponding to leakage to the processing unit only when the AM detected output signal includes the video modulated carrier component.

A speaker is provided for producing an audio output; and an audio circuit supplies the output signal corresponding to leakage to the speaker.

The leak processor includes a voltage controlled oscillator (VCO) driven by the output signal from the leak processor and which supplies a signal to the audio circuit such that the speaker produces an audio feedback tone having a pitch that increases with increasing level of the output signal corresponding to leakage and decreases with decreasing level of the output signal corresponding to leakage. The pitch of the audio feedback tone will vary with leakage intensity and the leakage intensity will vary with orientation of the antenna relative to, and distance of the antenna from, the leakage. Further, the processing unit disables the VCO when the output signal corresponding to leakage is below a threshold level.

Thus, the leak processor includes a VCO which is driven directly from the output signal corresponding to the leakage level. The VCO produces a signal which is used for audio feedback as an aid to leak tracing. The leak processor output is sufficiently accurate to be used as the direct control of the VCO frequency. The output signal from the VCO is fed to the audio amplifier and speaker in the unit to produce the audio feedback tone. The pitch of the tone increases with increasing leak signal level, and decreases with decreasing leak signal level. Due to the fast response of the leak processor, all variations in leak signal level, including additional AM modulation, can be heard via the tone.

In accordance with another aspect of the present invention, a combination signal level meter and leakage detector, includes a single receiver front end having an input for connection with an antenna or a cable for a CATV signal; an intermediate frequency (IF) stage connected with the receiver front end for producing an intermediate frequency signal; a detector having an input for producing an amplitude modulation (AM) detected output signal in response to the intermediate frequency signal; a leak processor operative in a leakage mode only when the antenna is connected with the single receiver front end, the leak processor having an input connected to the detector for removing noise from the AM detected output signal which is above and below the frequency of a synchronizing signal of the AM detected output signal, and which is not in frequency coherence with the synchronizing signal of the AM detected output signal, the synchronizing signal having a peak level, and the signal processor providing an output signal corresponding to the peak level of the synchronizing signal of the AM detected output signal; at least one signal detector for detecting characteristics of the CATV signal during a signal level meter mode, when the cable is connected with the single receiver front end; a display; and a processing unit connected with the leak processor, the at least one signal detector, and the display for displaying leakage data in response to the output signal from the leak processor during the leakage mode and for displaying the characteristics of the CATV signal during the signal level meter mode.

The at least one signal detector preferably includes a peak detector, an average detector and a hum detector.

Also, the single receiver front end is a wideband dual-conversion receiver front end, which includes a first heterodyne mixer which converts an input signal thereto to a first intermediate frequency signal; and a second heterodyne mixer which converts the first intermediate frequency signal to a second intermediate frequency signal which is supplied to the detector.

The IF stage maintains an IF bandwidth of 280 KHz for both the leakage mode and the signal level meter mode.

The detector further produces a detected frequency modulation (FM) output signal; and further includes a speaker for producing an audio output, and an audio amplifier for supplying the detected frequency modulation output signal to the speaker. A mute circuit is connected between the detector and the audio amplifier for preventing passage of the detected frequency modulation output signal, to the audio amplifier during the leakage mode.

In accordance with still another aspect of the present invention, a video signal detector includes a receiver front end having an input for connection with an antenna or cable; an intermediate frequency (IF) stage connected with the receiver front end for producing an intermediate frequency signal; a detector having an input for producing an amplitude modulation (AM) detected output signal in response to the intermediate frequency signal; a signal processor having an input connected to the detector for removing noise from the AM detected output signal which is above and below the frequency of a synchronizing signal of the AM detected output signal, and which is not in frequency coherence with the synchronizing signal of the AM detected output signal, the synchronizing signal having a peak level, and the signal processor providing an output signal corresponding to the peak level of the synchronizing signal of the AM detected output signal; a display; and a processing unit connected with the signal processor and the display for displaying video signal level data in response to the output signal from the signal processor.

The above and other objects, features and advantages of the invention will become readily apparent from the following detailed description thereof which is to be read in connection with the accompanying drawings.

DETAILED DESCRIPTION

Figure 1:
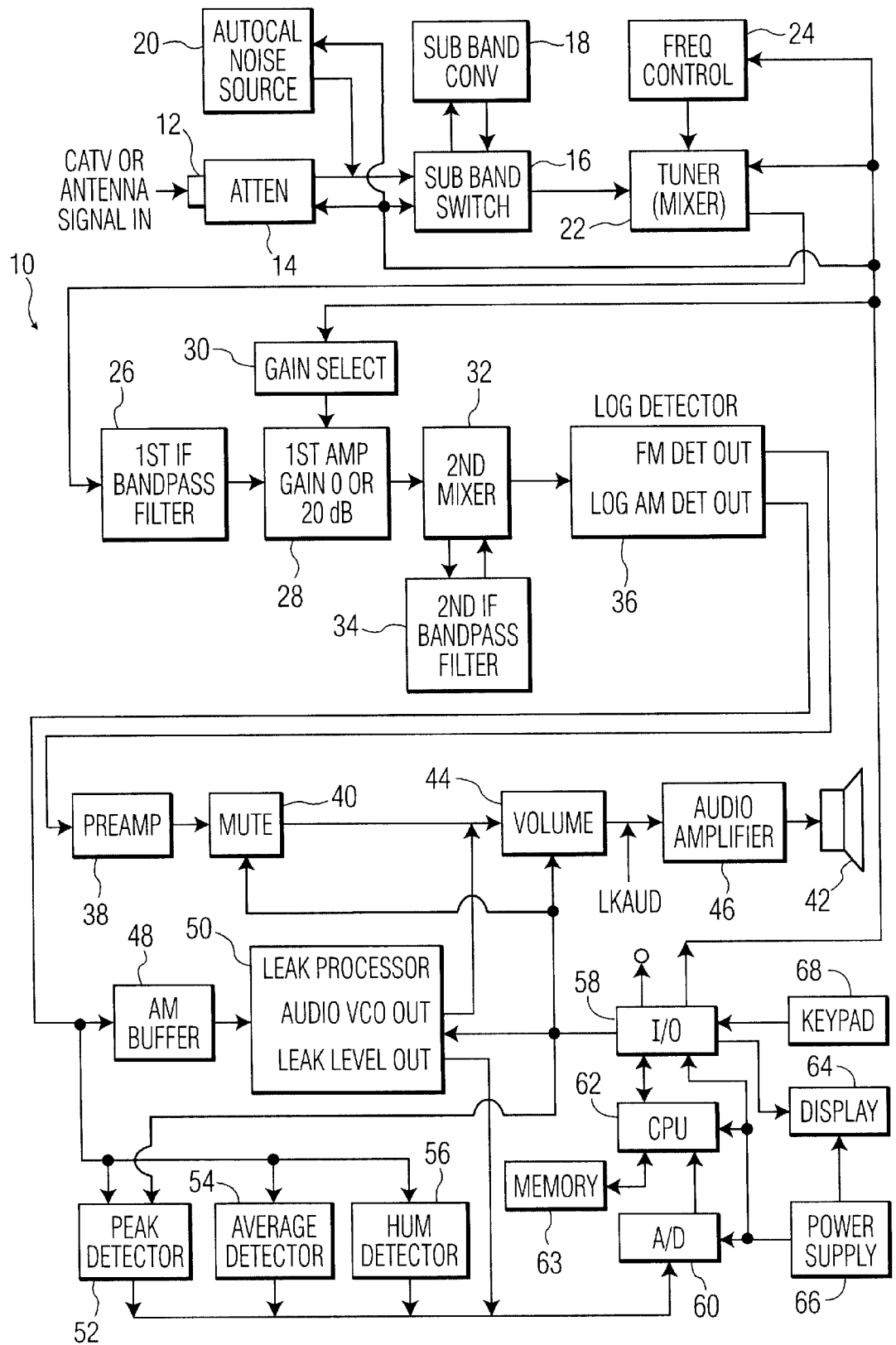
FIG. 1 is a general block diagram of a combination leakage detector and signal level meter, according to the present invention.

Referring to the drawings in detail, and initially to FIG. 1, a combination leakage detector and signal level meter 10 according to the present invention includes a single input 12 for receiving either a cable for measuring a cable or CATV signal, or an antenna, such as a rubber duck antenna, a dipole antenna and a monopole antenna, for searching and measuring leakage. The received signal from the cable or antenna is supplied to a stepped attenuator 14 which scales the input signal to optimize the signal for further processing, for example, attenuation by 0 dB, 20 dB or 40 dB, depending upon the level of the input signal.

The output from attenuator 14 is supplied to a sub-band switch 16 which routes the signal to a sub-band converter 18 which is a mixer that increases the frequency of low band CATV signals, for example, so that the frequency of the signal is in a desired operating range, and is provided for both the CATV video and for leakage, and then sub-band converter 18 routes the up-converted signal to the next stage.

An Autocal noise source 20, also connected to the input of sub-band switch 16, is an internal noise source which produces an output detected voltage. Noise source 20 is momentarily turned on when combination leakage detector and signal level meter 10 is first operated in order to provide a reference signal for testing and calibrating the circuitry at start-up. Thereafter, it is used periodically for calibration.

The output of sub-band switch 16 is then supplied to a tuner or first heterodyne mixer 22 which converts the input thereto to a first intermediate frequency (IF) signal of 38 MHz. In this regard, a frequency control 24 is connected thereto, to provide an appropriate oscillation signal thereto for the heterodyne process. The output from tuner 22 is then supplied to a first IF bandpass filter 26 having a bandwidth of 2 MHz and a center frequency of 38 MHz. The output is supplied to an IF amplifier 28 which provides a 0 dB gain for a CATV signal and a 20 dB gain for a leakage signal, depending upon whether a cable or antenna is connected to input 12 of combination leakage detector and signal level meter 10. In this regard, a gain select circuit 30 is connected to IF amplifier 28 for varying the gain thereof. It is noted that IF amplifier 28 is not essential to the circuit, but merely optimizes the result. Specifically, IF amplifier 28 scales the signal level to be supplied to the AM logarithmic detector which is discussed hereinafter to be within the detection range window of −55 dBmV to +5 dBmV. It is important to note that IF amplifier 28 does not improve the sensitivity of the signal thereto. This is because noise is added in tuner 22 before first IF bandpass filter 26, and is also amplified by IF amplifier 28, along with the leakage or CATV signal. In other words, the noise floor, as well as the leakage signal, is raised by IF amplifier 28. Therefore, unlike the preamplifier in the aforementioned prior art, the signal to noise ratio (sensitivity) is not improved by IF amplifier 28.

The signal is then supplied to a second mixer 32 which is connected with a second IF bandpass filter 34, such that the output signal therefrom has a bandwidth of 280 KHz and a center frequency of 10.7 MHz. With later detection, this translates to a baseband bandwidth of 140 KHz, which is sufficient to pass horizontal synchronizing components of the video signal, as will be apparent from the discussion hereinafter.

This signal is then supplied to an amplitude modulation (AM) logarithmic (log) detector 36 having two outputs, namely, FM DET OUT and LOG AM DET OUT. The logarithmic detector is effectively the same as the audio detector in U.S. Pat. No. 5,493,210, the entire disclosure of which is incorporated herein by reference.

It is important to note that the circuitry from bandpass filter 26 to second mixer 32 constitutes the IF stage, and there is no increase in sensitivity of the signal by combination leakage detector and signal level meter 10 in this section, as in the prior art. Thus, there is a common input connector, a common built-in calibration source, and a common dual-heterodyne receiver.

The output signal from FM DET OUT is an audio cable television (CATV) signal, which is supplied to a preamplifier 38 and then through a mute circuit 40. During the normal signal level meter mode, combination leakage detector and signal level meter 10 will tune to the audio carrier and the output signal from FM DET OUT, after being preamplified in preamplifier 38, is supplied to a speaker 42 through a volume control circuit 44 and an audio amplifier 46. In this manner, a person can listen to the CATV signal being monitored. However, during the leakage mode, mute circuit 40 mutes the output signal from FM DET OUT so that no sound is provided by speaker 42 as a result of the output from FM DET OUT.

The output signal from LOG AM DET OUT is used for leakage detection or signal level meter modes. In this regard, detector 36 effectively converts the input RF signal to a DC voltage, while removing the carrier to provide an output modulation signal. This output signal is a received signal strength indicator, and therefore, corresponds to the level of the input signal, that is, is proportional to the instantaneous power of the input carrier. Specifically, the output signal from LOG AM DET OUT is a DC signal of 0–4 volts and represents the logarithm of the signal strength (level) from second mixer 32. For an unmodulated carrier signal, the output signal from LOG AM DET OUT is a DC voltage proportional to the logarithm of the carrier strength. However, for a video modulated carrier, the output signal at LOG AM DET OUT appears similar to a small video signal with a DC component which is proportional to the logarithm of the signal level of the incoming signal, which includes noise, video carrier or both. The output signal has a range of about 50–60 dB, for example, –55 dBmV to +5 dBmV for the leakage mode and –35 dBmV to +20 dBmV for the signal level mode. It is noted that the DC component of the output signal represents the total average power, while the AC component represents the sum of carrier modulation and noise. Therefore, variations in the modulated carrier input level results in changes in the DC component.

However, the AC part, which constitutes the modulation plus noise, is fairly constant within the upper 35 dB portion of the 55 dB range, but becomes increasingly dominated by noise within the lower 20 dB portion of the 55 dB range of log detector 36.

The output signal from LOG AM DET OUT of detector 36 is supplied through an AM buffer circuit 48 to a leak processor 50 which enhances the leakage signal for further processing. Specifically, leak processor 50 filters out noise to increase the accuracy of the leakage measurement, since the leakage signal can be 10–20 dB below the level of the noise floor. In other words, for leakage measurement, the required measurement range must extend to signals to about –55 dBmV. However, as discussed above, noise from the receiver front end, for example, from tuner or first mixer 22, obscures signals at this low level. The classic way around this problem is to use a narrower IF passband and/or to also increase the level of the leakage signal prior to adding noise by the receiver front end. In this regard, dedicated leakage detectors, as well as combination leakage detectors and signal level meters use an IF bandwidth of 10–15 KHz to improve sensitivity for the leakage measurement. However, as discussed above, this has the drawback that the lowered IF bandwidth does not allow the peaks of the horizontal synchronizing signal to appear at the AM logarithmic detector output LOG AM DET OUT, so that the speed of response to signal level changes is fundamentally limited to the detection and processing of peaks of the vertical synchronizing signals. Some leakage detectors have even much narrower bandwidths, and consequently, can only respond very slowly to the average value of the video carrier power, and not even to the peaks of the vertical synchronizing signal. In such case, there is a measurement variation unrelated to the peak carrier level, due to constant changes in the video signal. Also, the use of a narrow IF bandwidth requires greater tuning precision in the tuner and in the electronic tuning control.

The present invention avoids this route for processing the leakage signal, and maintains the same IF bandwidth of 280 KHz for both the leakage detection mode and the signal level meter mode, as will be discussed in greater detail hereinafter.

The output signal from LOG AM DET OUT of detector 36 is also supplied to a peak detector circuit 52 which detects the peaks of the CATV signal, an average detector circuit 54 which detects the average signal level of the CATV signal and a hum detector 56 which detects any hum in the CATV signal, all in the signal level meter mode.

The outputs from leak processor 50, peak detector 52, average detector 54 and hum detector 56 are all supplied to an analog-to-digital (A/D) converter 60, which supplies the respective digitized signal to a central processing unit (CPU) 62, where the signals are processed. The results of the processing can be viewed on a display 64, such as a liquid crystal (LCD) display or the like. A battery or AC adapter power supply 66 is also connected with CPU 62 for supplying power to combination leakage detector and signal, level meter 10, and a keypad 68 is connected with CPU 62 for controlling the operations of combination leakage detector and signal level meter 10. An input/output (I/O) circuit 58 is also connected with CPU 62.

Figure 2:
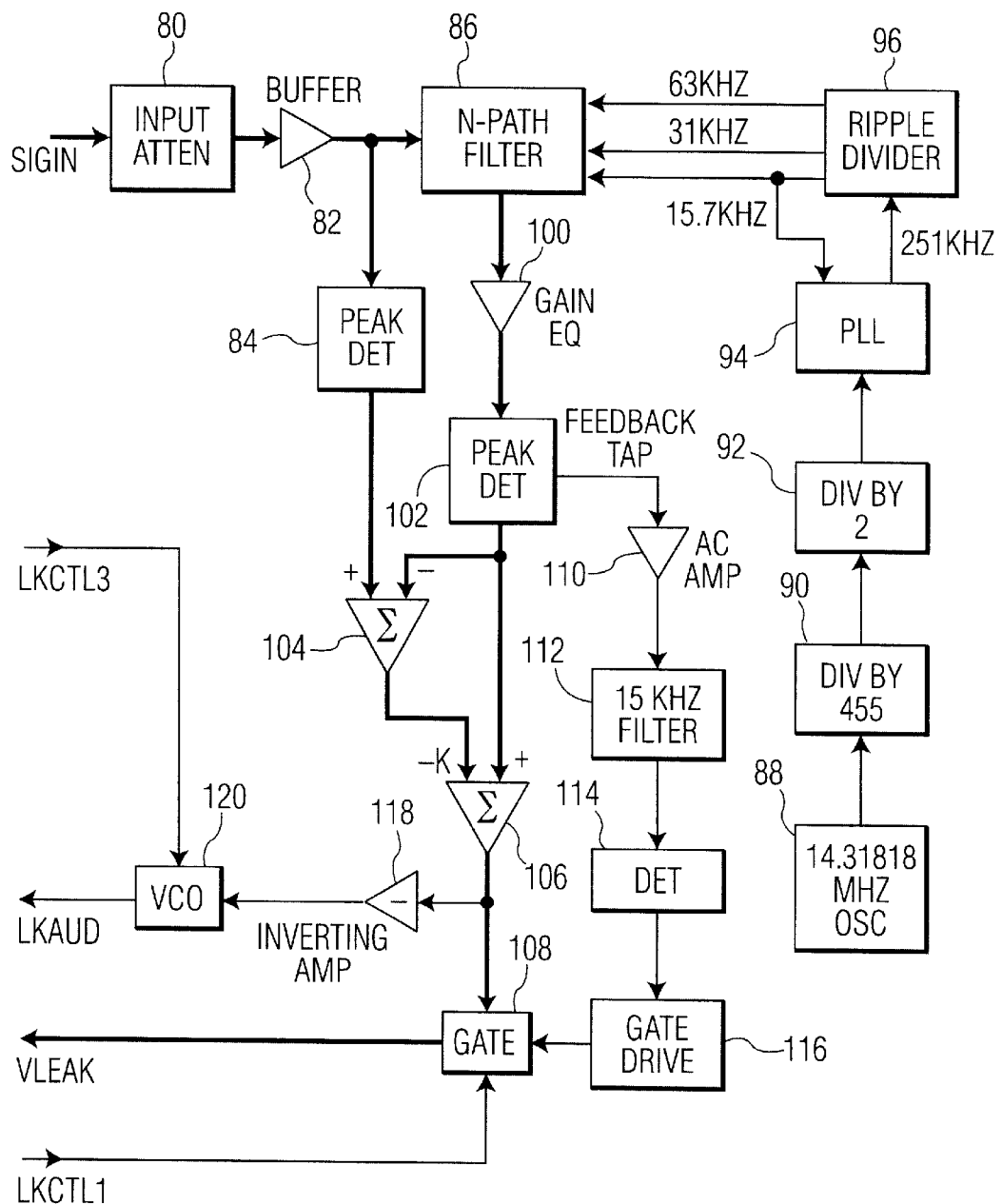
FIG. 2 is a block diagram of the leakage processor of the leakage detector.

Referring now to FIG. 2, a detailed description of leak processor 50 will now be provided.

Specifically, the output from AM buffer 48 is supplied as an input signal SIGIN to an input attenuator 80 which sets the range of the signal for the following filter processing circuit, that is, input attenuator 80 adjusts the DC level so that it is not greater than 5 volts. In other words, attenuator 80 provides scaling so that the signal is in the dynamic range of the following N-path filter. The output signal from input attenuator 80 is supplied to a buffer amplifier 82, which functions as an isolating buffer and a low impedance drive for the remainder of the circuit.

The output signal from buffer amplifier 82 is supplied to two different paths, a non-filtered path to a first peak detector 84 and a filtered path to an N-path filter 86. First peak detector 84 provides an output signal. corresponding to the peaks of the signal supplied thereto. In this case, the signal supplied to first peak detector 84 includes both the video signal and noise.

N-path filter 86 removes AC noise. Specifically, N-path filter 86 passes the average value of the log detected video plus noise, which is a DC level, and the horizontal synchronizing signal fundamental and harmonic components of the horizontal synchronizing signal. N-path filter 86 is clocked to filter out noise, and specifically, is clocked at a multiple rate corresponding to the horizontal synchronizing frequency. Since noise is random in frequency and phase, most of the noise which is not frequency coherent with the horizontal synchronizing frequency is eliminated. The average noise strength or power, which is a DC level, is passed through the filter in combination with the average video carrier level. In other words, the average DC noise power level still remains, but the AC noise is effectively eliminated.

N-path filter 86 is an analog sampled data filter which includes a bank of n capacitors C25–C32 that are successively switched to a common node X of a clocked analog multiplexer U11. The other sides of all capacitors C25–C32 are connected to ground. The basic topology is that of an RC low pass filter. The frequency response is that of a comb filter with a response at DC. The clocking sample rate is n times the desired fundamental AC frequency. For leak processing, the sample clock is 8×15.734 KHz, that is, about 125 KHz.

Since the multiplexer U11 has a built-in decoder which uses both phases of the highest input clock, the maximum external input clock required is about 63 KHz. Since both phases are used, a sample clock of 125 KHz is obtained.

N-path filter 86 thereby filters AC and DC components of the AM logarithmic detected video signal to obtain the values of the peaks of the horizontal synchronizing signal, while maintaining a fast response and high filtering efficiency.

The clocking of N-path filter 86 is controlled by circuitry, starting with a 14.31818 MHz crystal oscillator 88 which is used to set the filter tuning according to a conventional television signal. The output oscillation signal is supplied to a divide by 455 circuit 90 and then to a divide by 2 circuit 92, followed by a phase locked loop (PLL) 94, and a ripple divider 96. PLL 94 supplies a 251 KHz clock signal to ripple divider, and ripple divider 96 feeds back the 15.734 KHz clock signal to PLL 94. The outputs from ripple divider 96 supply clock signals for N-path filter 86. Thus, ripple divider 96 provides input clock signals of 15.734 KHz, 31 KHz and 63 KHz to N-path filter 86.

Figure 3:
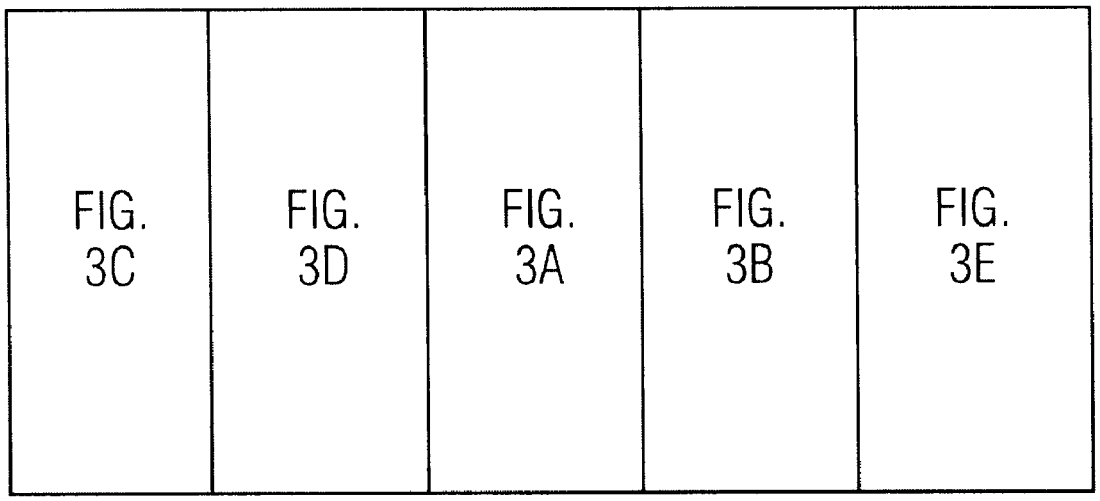
FIGS. 3A–3E together form the circuit wiring diagram of the leakage processor of FIG. 2.
Figure 3A:
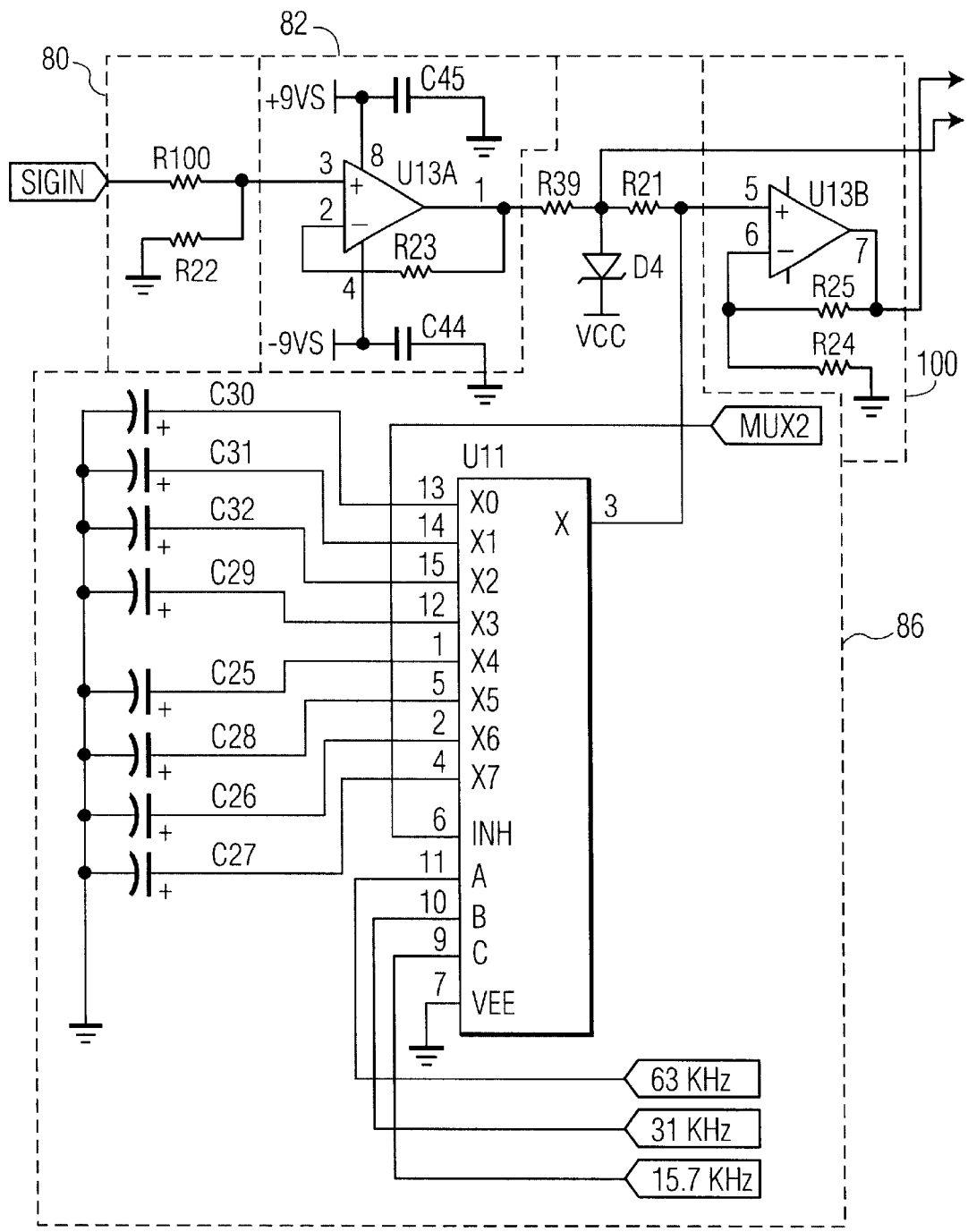
Figure 3B:
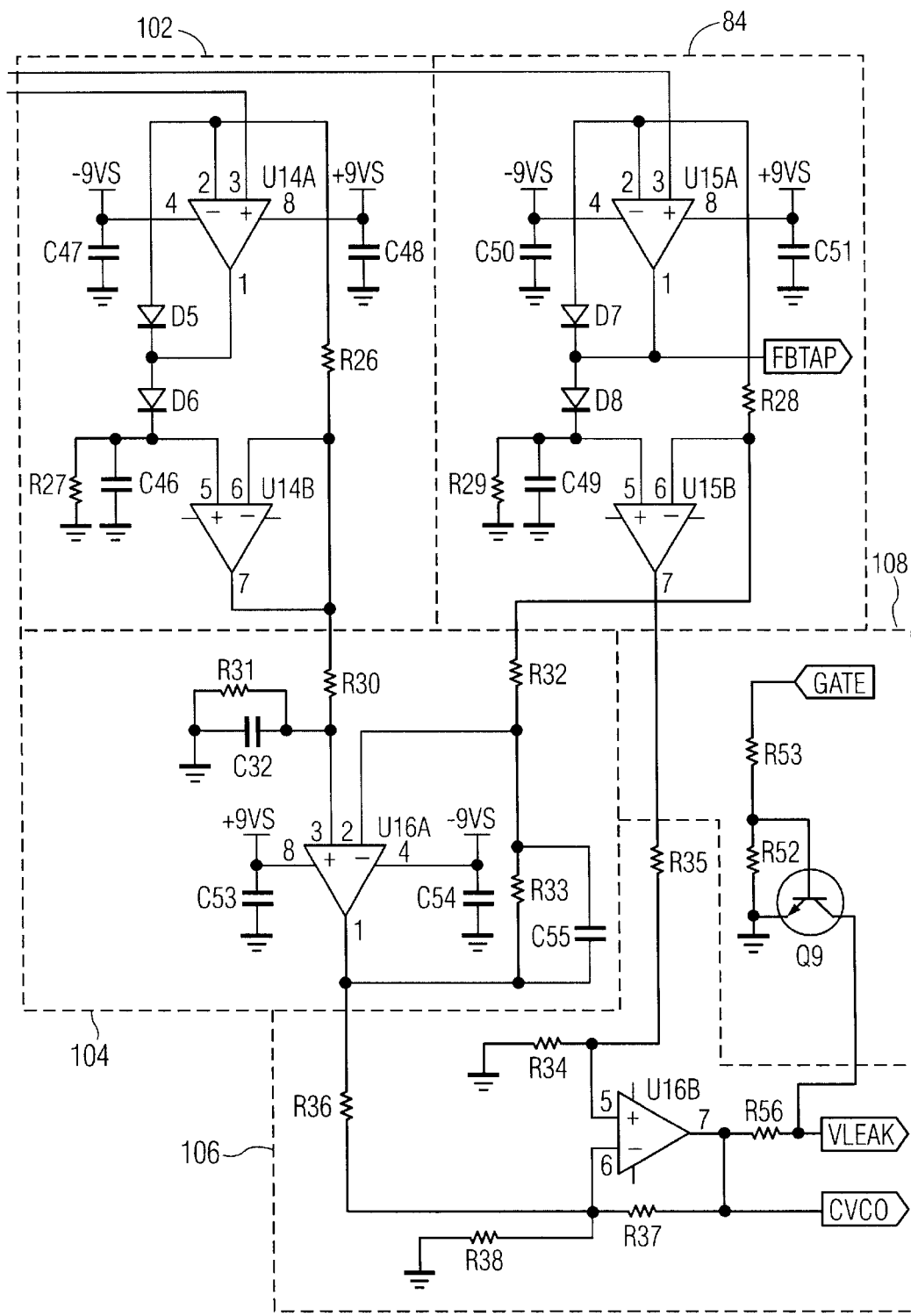
Figure 3C:
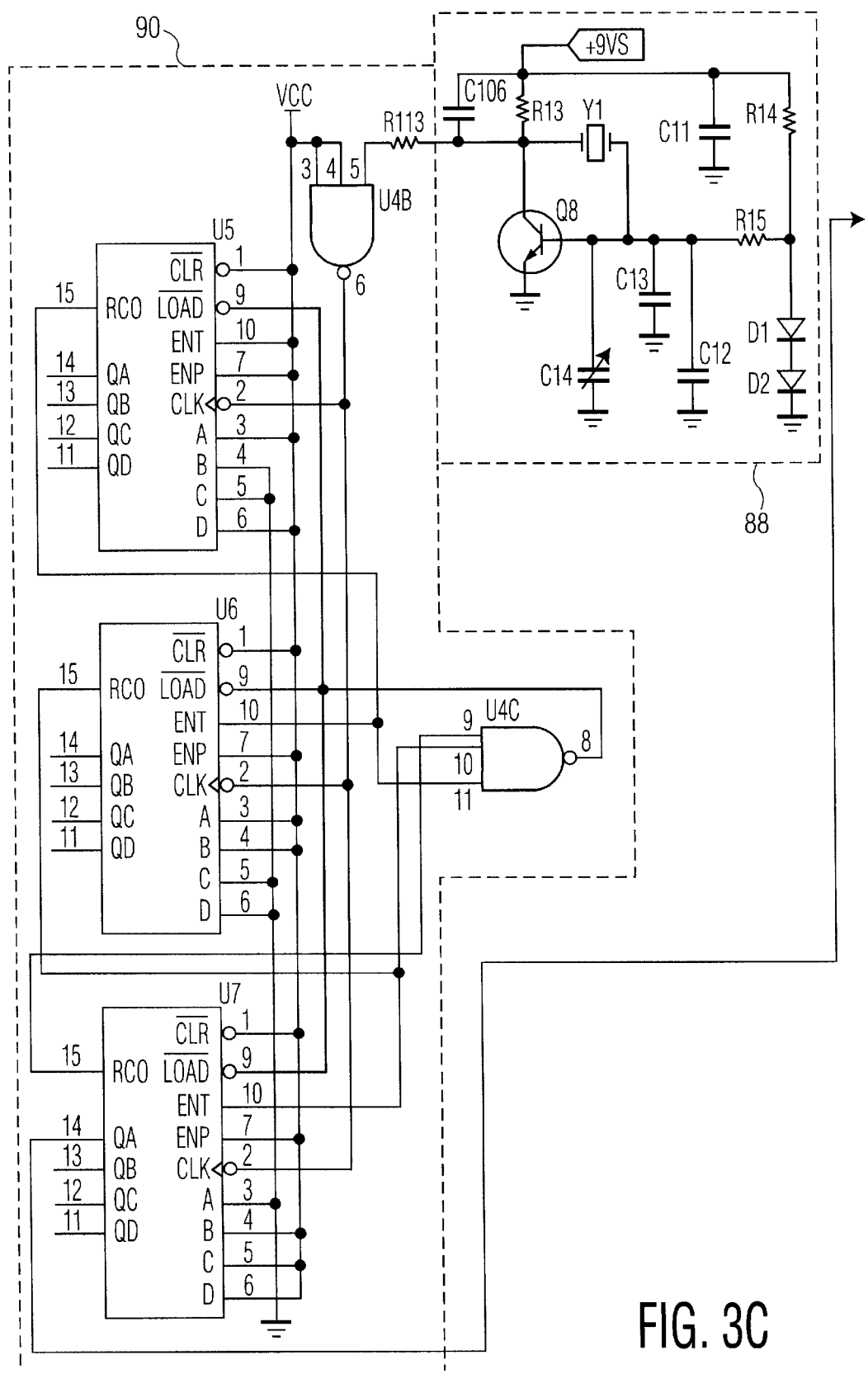
Figure 3D:
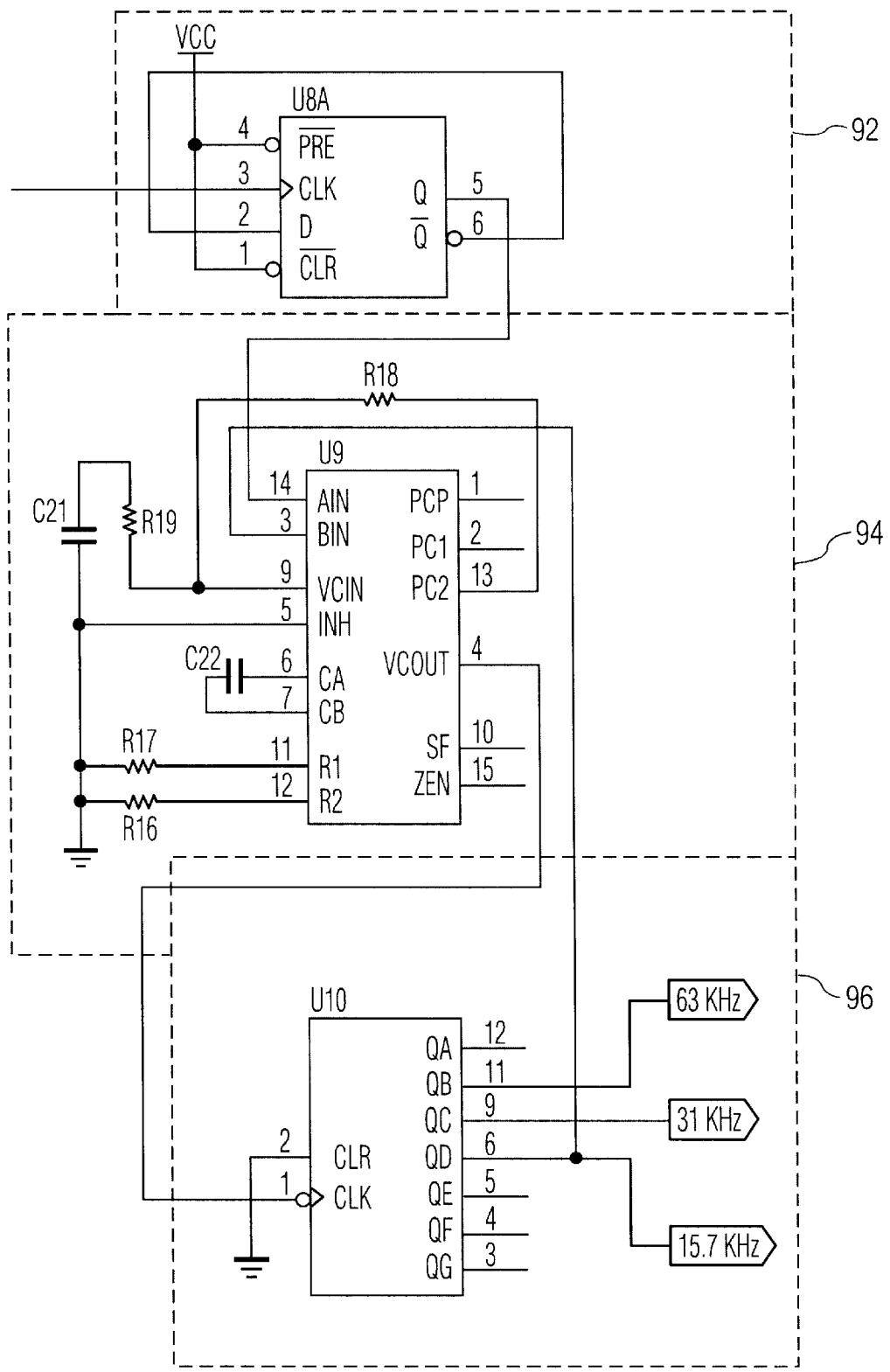
Figure 3E:
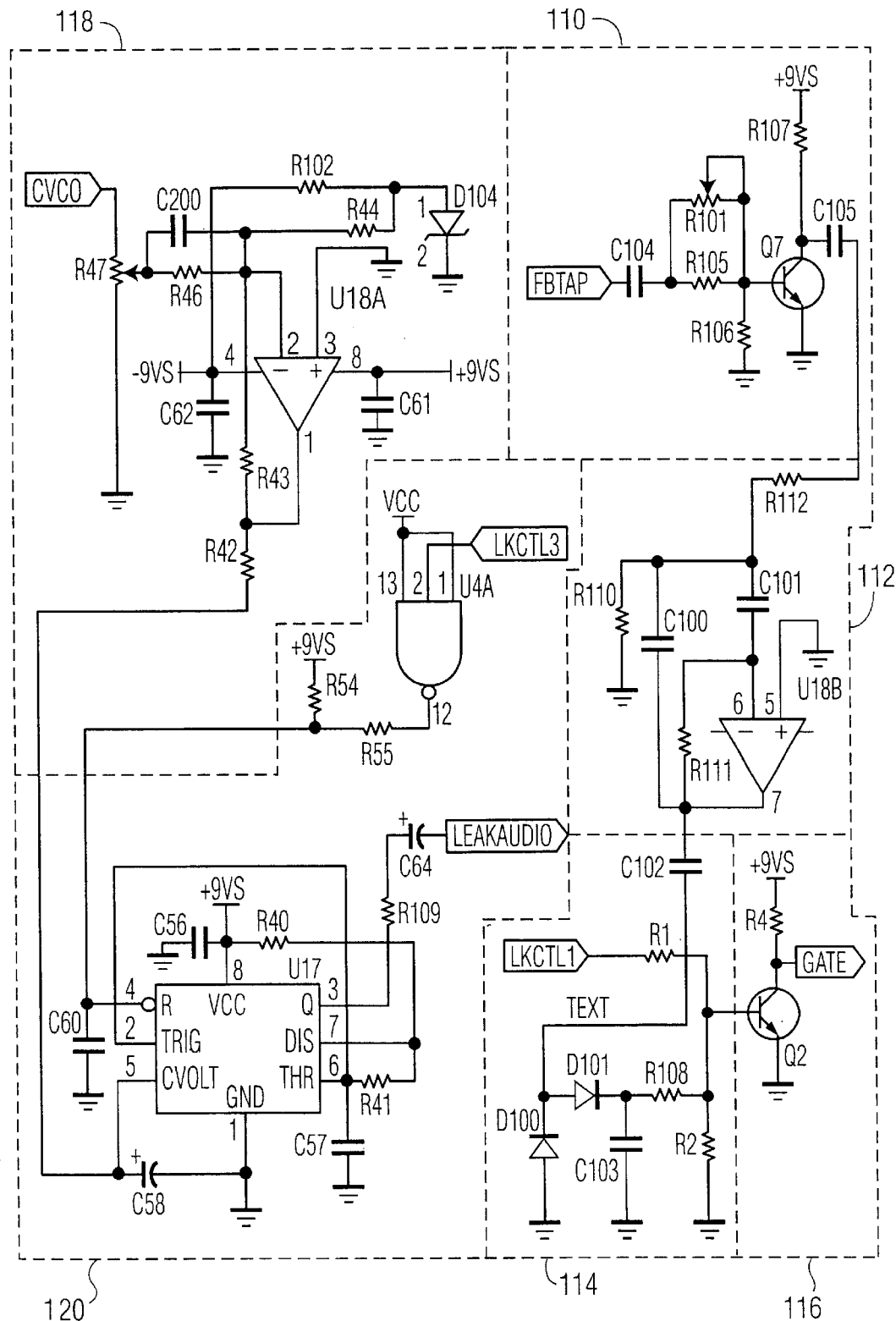

It is pointed out that the clock frequency of oscillator 88 is adjusted at the factory by capacitor C14 in FIG. 3C to produce a drift of the sampling pedestals with respect to the horizontal synchronizing frequency in N-path filter 86. This can be heard as a 3–4 Hz warble in the audio feedback tone through speaker 42, and clearly identifies a video modulated carrier. In this regard, it is noted that an unmodulated carrier wave (CW) signal has no such warble. Detection of a video signal can therefore be easily ascertained.

The output from N-path filter 86 is supplied to a gain equalization amplifier 100 which is used for gain equalization to compensate for losses in N-path filter 86. The output from gain equalization amplifier 100 is supplied to a second peak detector 102. The output from first peak detector 84 is supplied to the non-inverting (positive) input of a first difference amplifier 104 and the output from second peak detector 102 is supplied to the inverting (negative) input of first difference amplifier 104, which provides an output signal corresponding to the AC noise present in the output signal from peak detector 84, since the noise was removed from the output signal from peak detector 102 by N-path filter 86.

It is pointed out that conventional peak detectors normally quickly charge to the positive peak of the synchronizing signal which is input thereto, and then hold that value until either a larger peak or a reset pulse occurs. Peak detectors 84 and 102, however, are lossy peak detectors. With a lossy peak detector, the output sags slowly to zero in the absence of further peaks. It is noted that there can be problems in using a lossy peak detector with peaks of the vertical synchronizing signal in view of this sag time constant problem. If the sag time constant is slow enough to give a reasonably steady output, for example, within 1 dB, on an unchanging video carrier level, the system will have a very slow response. In such case, the 1 dB sag translates into a response, without further averaging, ranging from about DC to 1 Hz, which is very slow for leak tracing.

The present invention, on the other hand, uses the peaks of the horizontal synchronizing signal, so that peak detectors 84 and 102 charge to the positive peak of the horizontal synchronizing signal which is input thereto, and sag sufficiently to track decreases in the peaks due to level changes, thereby providing a very fast response for leak tracing. Specifically, a lossy peak detector follows the peaks of the synchronizing signal. If the peaks vary in level, it is desirable to having the peak detector drift downward to detect the varying level peaks. Since a lossy peak detector has a shorter time constant, it can follow decreasing level changes very quickly, so that the peaks of the horizontal synchronizing signal can be used effectively. Therefore, the lossy peak detector will follow changes in the peaks of the horizontal synchronizing signal, even when they change at a fast rate.

Returning back to FIG. 2, first difference amplifier 104 provides an output signal corresponding to the difference in peak value produced by the noise, that is, a DC level corresponding to the noise. The output from first difference amplifier 104, corresponding to the noise, is supplied to the inverting (negative) input of a second difference amplifier 106, which input also multiplies the signal by a factor K. It has been found that K=0.5 provides optimal results in test results, although for most instruments, the range of K can be from 0.1 to 1.0 according to modeling and statistical analyses. The non-inverting (positive) input of second difference amplifier 106 receives the signal from second peak detector 102, so as to subtract the DC level which is proportional to noise power at the output of first difference amplifier 104 from the filtered signal at the output of second peak detector 102, to arrive at a more accurate level of the video signal.

Since peak detectors 84 and 102 use the horizontal synchronizing pulses and in view of some additional low pass filtering by capacitor-resistor pairs C32, R31 and C55, R33 in difference amplifiers 104 and 106, tracking of signal level changes can be easily accomplished up to a rate of 30 Hz. The low pass filtering is provided to smooth the signal, that is, to reduce ripple in the outputs from the peak detectors 84 and 102. Such filtering is a first order filtering.

Of course, it will be appreciated that difference amplifiers 104 and 106 can be combined into a single difference amplifier to perform the same operation. The only reason for using two difference amplifiers 104 and 106 is to more easily adjust the value K.

Figure 4:
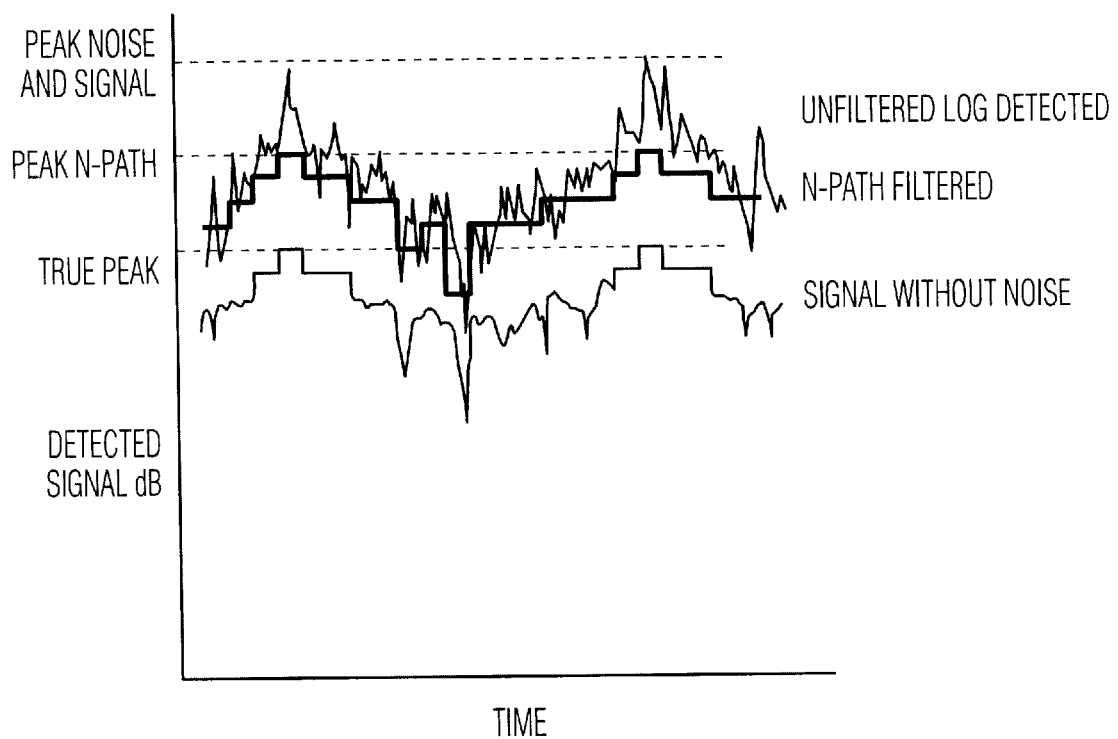
FIG. 4 is a waveform diagram showing various signals from the leakage processor.

The output signal VLEAK of second difference amplifier 106 corresponds to the video signal with the noise removed. This is best shown in FIG. 4. Specifically, FIG. 4 shows an idealized example of an unfiltered logarithmic detected output signal from LOG AM DET OUT of log detector 36 for a video modulated carrier. As clearly shown, this top waveform includes a noise variation and a DC level shift due to average noise power. The actual signal looks much worse. The peaks of the signal without noise correspond to the horizontal synchronizing signal and thereby the maximum carrier level, which is the desired level to measure. As the carrier level decreases towards the noise floor, the noise contribution begins to dominate and the synchronizing peaks become lost under the noise peaks. Below some input carrier level, with the sum of the decreasing signal level and the constant noise approaching the lower limit of log detector 36, there is no perceptible change in the output of log detector 36. As a result, there is a compression in the video signal and a gradual leveling out since the amplitude response is mostly due to the average (DC) component of the noise.

However, when the output signal from LOG AM DET OUT is supplied through N-path filter 86, the filtered output is a sampled version of the small level video signal with the DC component intact. The variation in noise is virtually eliminated down to the minimum carrier input. The N-path filtered signal shown in FIG. 4 is cleaned up, but still has some upward DC shift due to the average noise power. It is noted that the peak noise and signal in FIG. 4 is at a different level than the peak N-path signal in FIG. 4. This difference is roughly proportional to the amount of noise in the LOG AM DET OUT signal, and is used as an estimate of the noise power. For this reason, the difference DC value is multiplied by a constant K at the input of second difference amplifier 106 and subtracted from the N-path filtered peak value at the output of peak detector 102, to yield a value closer to the true peak of the idealized signal without noise, as also shown in FIG. 4. This true peak signal at the output of second difference amplifier 106 is a low level signal without any noise, and is the ideal signal that should be output by leak processor 50.

It will be appreciated, however, that with the above processing through leak processor 50, the output signal VLEAK at second difference amplifier 106 is only an approximation of the ideal signal without noise. For example, because the subtraction of a logarithmic difference signal is equivalent to a division operation, the operation would be more accurate if it were done on linear detected values. However, this would involve additional processing to linearize that part of the output range, and then make it logarithmic again.

Fortunately, the process in leak processor 50 is aided by three factors. First, the range where leak processor 50 is operating the most is the lowest 10 dB of the signal so that any errors are minimized. Second, log detector 36 itself tends to linearize towards its lower limit where it levels out, so as to further minimize any errors. Third, individual tuner noise and characteristics of log detector 36 are corrected at the factory for measurement purposes by use of a set of stored correction values in a memory 63 generated during leakage calibration.

The output of second difference amplifier 106 is supplied to a gate 108 which passes the output signal VLEAK with substantial noise reduction to A/D converter 60. In other words, the signal VLEAK is the leakage signal with most of the AC noise and components of DC noise (noise power) removed.

In order to pass only the leakage signal, and not other carrier wave signals, such as radar from airplanes, CB radios, etc., there also must be discrimination between video and non-video modulated carriers. In this regard, an output of second peak detector 102 is supplied as a feedback tap to an AC amplifier 110 which amplifies the signal, and the output is supplied to a 15.734 KHz filter 112 which produces a large sine wave signal at 15.734 KHz if the input to the meter is a video carrier. Next, a detector 114 detects the presence of the sine wave signal and provides a signal at an appropriate level for driving gate 108. The output signal from detector 114 is supplied to a gate drive circuit 116, which opens gate 108 only if there is a video signal. Further, gate 108 is controlled to open only in the leakage mode and in accordance therewith, is also supplied with another control signal LKCTL1 from CPU 62. Gate 108 is thereby controlled to be open only during the leakage mode and only when the received carrier is video modulated, that is, only when a video signal is detected.

Thus, with the above circuitry, the leakage signal is detected and then processed by substantially reducing the noise after the IF stage and AM log detector. Rather than using a narrower IF passband and/or increasing the level of the leakage signal prior to adding noise by the receiver front end, the special filter processing of leak processor 50 recovers the AM logarithmic detected leakage signal which is below the noise floor. This is accomplished by a number of factors in leak processor 50. First, N-path filter 86 filters the AC and DC components of the AM logarithmic detected video signal to obtain the value of the peaks of the horizontal synchronizing signal, while maintaining a fast response and high filtering efficiency. Second, there is the derivation of a noise power estimated value based on the difference at first difference amplifier 104 between the peak unfiltered signal from first peak detector 84 and the peak filtered logarithmic detected signal from second peak detector 102. Third, there is the subtraction of the noise power estimate value at the output of first difference amplifier 104 from the peak filtered value from second peak detector 102, to arrive at a new DC level which is a useful approximation to the actual carrier signal strength. Lastly, there is the correction of the processed approximation of the carrier signal strength for measurement purposes, by means of a set of stored correction values for each combination leakage detector and signal level meter 10.

Due to the fast response of leakage processor 50, any amplitude variation from DC up to around 30 Hz is audible as an audio feedback tone. In this regard, carrier wave signals or video carrier signals that have been tagged at the head end produce a distinctive warble faster than that of video modulation alone, and will also be detected.

It is noted that the filtering and noise power subtraction steps discussed above work equally well for any carrier wave (CW) signals, because of the fact that N-path filter 86 has unity gain at DC.

In addition to the above, the output of second difference amplifier 106 is supplied to an inverting amplifier 118 which inverts the signal and supplies the inverted signal to an audio frequency, voltage controlled oscillator (VCO) 120. VCO 120 responds to the level of the signal input thereto, and provides a signal LKAUD as audio feedback to the input of audio amplifier 46, thereby providing an indication of leakage to the operator. However, if the signal VLEAK is too low, CPU 62 provides a signal LKCTL3 to VCO 120 to disable VCO 120 and prevent any audio signal from being supplied to speaker 42. On the other hand, if VLEAK is above a threshold level, the pitch of the audio signal from speaker 42 will increase with increasing signal level or strength. Therefore, a person can move an antenna connected to combination leakage detector and signal level meter 10 to different positions to find the leak.

In this regard, VCO 120 is driven directly from the processed carrier signal strength voltage, in order to provide a fast responding audio feedback to allow easy tracing of leakage sources.

Although the present invention has been discussed in relation to leakage operations for a CATV signal, leakage processing circuitry in combination leakage detector and signal level meter 10 can be used for measuring and detecting video signals below the noise floor, for example, measuring low level intermodulation distortion spurs from multiple video carriers in the signal level meter (SLM) mode, as a stand-alone leakage detector/leak tracer, and as a very low level (although slow responding) detector by combining very narrow IF filtering with the aforementioned process of filtering and noise power subtraction. In the latter case, post detector filtering could be performed bye the N-path filter or a conventional low-pass filter, depending upon the requirements. The signal processing circuitry of the present invention can also be used to measure low level television broadcast signals input via a cable, or low level television broadcast signals received by an antenna.

Figure 5:
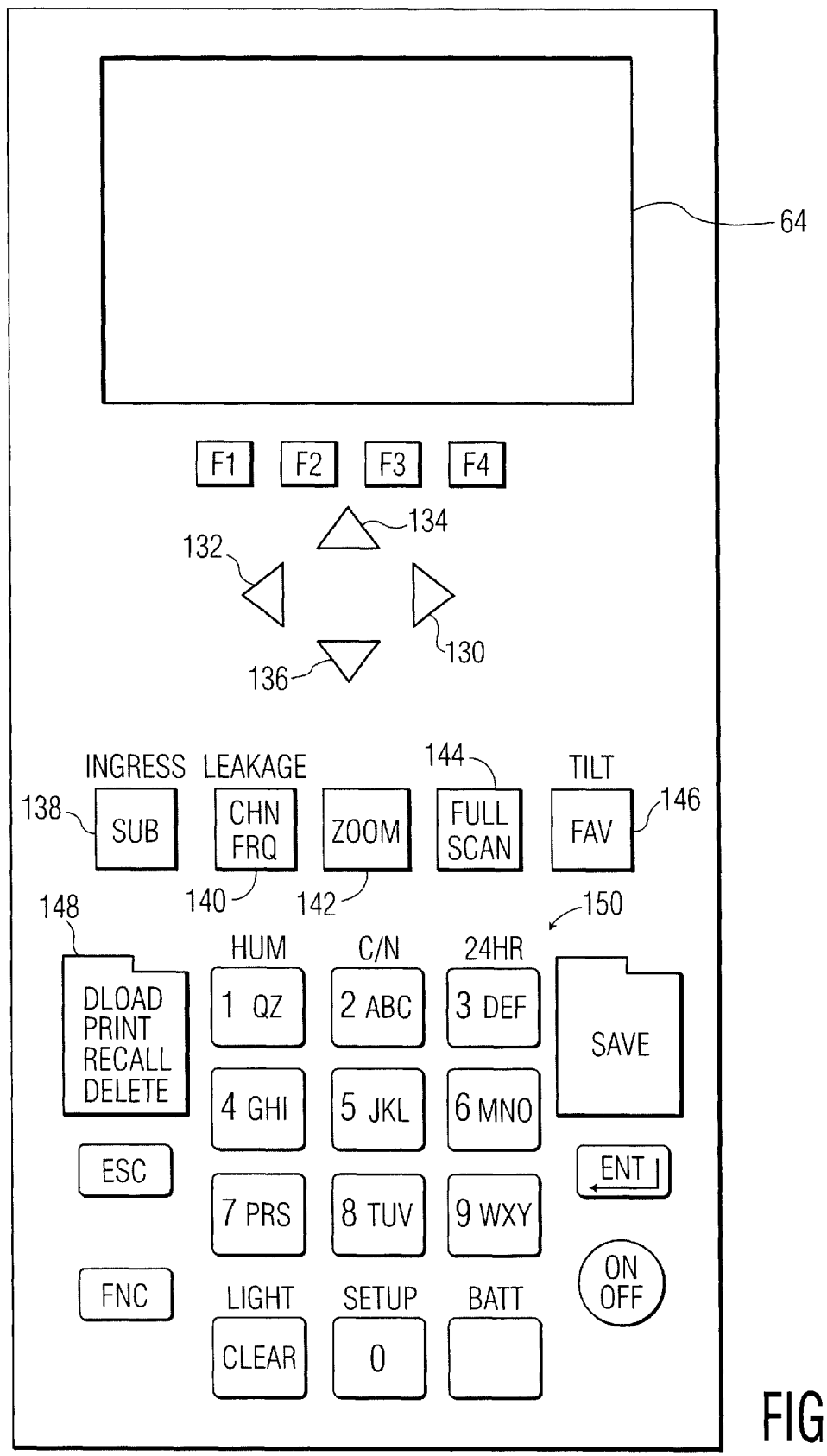
FIG. 5 is a plan view of the front panel of the combination leakage detector and signal level meter.

The front panel of combination leakage detector and signal level meter 10 is shown in FIG. 5. Specifically, the front panel includes display 64, four function keys F1, F2, F3 and F4, right and left arrow keys 130 and 132, up and down arrow keys 134 and 136, main tuning mode keys 138, 140, 142, 144 and 146, operational key 148, alphanumeric keys 150, an escape key ESC, a function key FNC, a save key SAVE, an enter key ENT, a clear key CLEAR and an on/off key ON/OFF.

The function performed when function keys F1, F2, F3 and F4 are depressed, varies with the selected operation. Icons and labels in the display screen identify each function. As to the right and left arrow keys 130 and 132, in the tuning modes, they move the cursor to select the next channel or frequency, while in the setup mode, they move the cursor right or left. In addition, in combination with the function key FNC, the right and left arrow keys 130 and 132 increase or decrease the volume. As to the up and down arrow keys 134 and 136, in the tuning modes, they adjust the vertical scale on display 64, while in the setup mode, they scroll up or down the screen of display 64. In addition, in combination with the function key FNC, the up and down arrow keys 134 and 136 increase or decrease the contrast.

The main tuning mode keys 138–146 are provided for selecting tuning modes, while keys 138, 140 and 146 also function as INGRESS, LEAKAGE and TILT keys in combination with function key FNC. Operational key 148 functions to download, print, recall and delete saved measurements.

Escape key ESC serves to go back up menus, while function key FNC is used to select various function modes in combination with other keys, namely INGRESS with key 138, LEAKAGE with key 140, TILT with key 146, HUM with alphanumeric key "1", C/N with alphanumeric key "2", 24 HR with alphanumeric key "3", LIGHT with clear key CLEAR, SETUP with alphanumeric key "0", and BATTERY with the period key.

The enter key ENT, in tuning modes, completes numeric channel entries, and in setup mode, completes edits. The clear key CLEAR clears a keypad entry before it is finalized with the enter key ENT, and clears the peak hold in the leakage mode. The save key SAVE saves measurements and scans. Finally, as to alphanumeric keys 150, in the tuning modes, they select the channel when followed by depression of the enter key ENT, and in the setup mode, they complete any edits.

There are two modes of leakage detection, namely, search and measurement. The search mode is intended to help locate leaks, while the measurement mode allows making calibrated leakage measurements. Leakage measurement, even under the best circumstances, can be tricky. Environmental factors, intermittent leaks, and non-CATV transmissions make it difficult to pinpoint the source of leaks, as discussed above. Further, antenna considerations, distance and frequency make accurate measurements difficult.

Meter 10 provides various features to help make locating, identifying, and measuring leaks easily, namely, an audible tone with a pitch that varies with the relative strength of the leak and a warble in the audio tone which distinguishes video leaks versus non-video leaks, a video synchronizing pulse filter (elements 108–116) that distinguishes video leaks versus non-video signals, an adjustable squelch control (mute circuit 40), a built-in attenuator which de-sensitizes the leakage detector for near field detection, a peak hold mode (FIG. 2) which helps locate and record peak leakage levels, on screen tuning and distance adjustment, $\mu$V/M measurement automatically corrected for distance, antenna type and frequency, and an adjustable bar graph threshold marker. Since the VCO 120 changes pitch in response to changes in amplitude, any variations in amplitude including amplitude modulated tags, will also be audibly detected.

During leakage detector setup, various parameters can be modified by the user in setup and leakage detection. Specifically, the default frequency is the initial frequency that meter 10 will tune on start up. The factory default is 133.250 MHz, which is the video carrier of Channel 16 of the EIA channel plan. If the current channel plan contains an active channel that matches the default frequency, meter 10 will tune to that video carrier and remain in the channel tuning mode. If there is no active video carrier at the default frequency because it has been deleted or meter 10 is in another channel plan, meter 10 will tune to the default frequency and switch to the frequency tuning mode. It is noted that the length of the dipole must be adjusted for frequency.

The default mode determines which mode, search or measurement, will be activated upon turn-on. Once in the leakage mode, function key F3 toggles between these modes. The default distance is only important for the leakage measurement mode, and is the initial distance setting used in the automatic leakage measurement calculation. It can also be changed during leakage measurements by pressing function key F4, and then entering a new distance. The level units are only important in leakage measurement mode, and are the measure used for leakage. Although the factory default is $\mu$V/m, a user can also select $\mu$V, dBmV, dB$\mu$V.

The antenna select is only important in leakage measurement mode. This function determines which antenna factor is used in the leakage measurement calculation. In the leakage search mode, the antenna select does not need to match the antenna type being used. The antenna factor is only important in leakage measurement mode. There are three programmed antenna factors, 100 for the dipole, 90 for the monopole and 65 for the rubber duck. These factors, which compensate for the lower relative gain of monopole and duck antennas, are automatically applied to the leakage measurement calculation. While the FCC requires the use of a dipole antenna for official leakage measurements, this feature allows making approximate measurements using a monopole or duck antenna. In addition, each of these antenna factors can be adjusted to calibrate a specific measurement system (meter, antenna, truck mount, distance) using a calibrated leakage field.

The threshold is only active in the leakage measurement mode, and adjusts the bar graph threshold marker. Squelch is active in both search and measurement modes. Peak clear is active in both search and measurement modes. In the default setting, peak level indicators remain until manually reset using function key F2. A 5 second setting automatically resets peak level indicators every 5 seconds. As to video gating, the default setting of OFF allows detection of all types of signals, while an ON setting allows only video signals to pass.

After the above settings are modified, if at all, meter 10 is ready for leakage search and measurement. If function key FNC and main tuning mode key 140 (LEAKAGE) are pressed, the leakage search mode will be entered. By pressing function key F3, meter 10 will toggle between the leakage search mode and the leakage measurement mode.

It is noted that various tones through speaker 42 provide different identifications. For example, with the cable attached, if meter 10 is tuned to an audio carrier, such as channel 16 at 137.75 MHz by entering the frequency number, and then pressing the enter key ENT, a steady tone is heard, that is, this is the tone that will be heard when the signal is not a video carrier. If main tuning mode key 140 (CHN/FRQ) is pressed, meter 10 will automatically tune to the video carrier of the channel, and a warble tone generated by a video carrier will be heard. When a person searches for a video leak in the cable system, the person listens for a warble in the audio tone.

In the search mode, a rubber duck antenna is connected directly to input 12 or through a three foot cable to input 12. The use of a three foot cable allows easier movement of the antenna. Then, the user tunes to a video carrier in the 108–140 MHz range. It is noted that channel 16 is the default setting in leakage setup mode. As discussed above, meter 10 uses a wide IF bandwidth (280 KHz) for both signal level measurement and leakage detection, which eliminates the need to adjust channel tuning for aeronautical offsets in either signal level or leakage modes. Accurate readings are obtained by tuning to the standard frequencies of the video carriers. The antenna is then moved through any area and along any cable where a leak is suspected. Common sources of leaks include splices and fittings which may be loose, corroded or damaged, and customer hook-ups using low grade devices, no connectors, and missing terminations. Less common sources of leakage include television sets, video cassette recorders (VCRs), and computers, poorly made fittings, damaged, compressed or low quality cable, and bad converters. The user then listens for any tone from speaker 42 and watches the bar graph on display 64 to determine if there is a leak. The higher the pitch, the larger the leak. At three feet away, and using a rubber duck antenna, meter 10 will pick up leaks equivalent to 4 $\mu$V/m at 10 feet. No tone or bar graph indicates that no leakage signal has been found.

The user listens for a relatively slow warble tone which is generated when the leak source contains video (AM type) modulation. If the leak source is a carrier wave (CW) signal, an FM modulated carrier such as a ham radio, or noise, the tone will be steady. It is important, however, to investigate all leaks, even those producing a steady tone, since what appears to be a single leak, may be the composite of more than one leak. Just as a single, strong video leak can mask any number of smaller video leaks, a single, strong non-video leak can also mask smaller video leaks. This will result in hearing only a steady tone until the strong, non-video leak is eliminated, allowing one to detect the smaller video leaks. The leak is located by moving the rubber duck antenna around, which will be most sensitive when held parallel to the leak and will null when pointed directly at the leak.

The user listens for a faster warble on "tagged" channels. Some cable systems employ a channel tagger that amplitude modulates one of the video carriers. This modulation, which is designed to help differentiate the source of a leak, can be heard as a fast warble on the audio tone of the leakage detector. In order to differentiate this warble from the slower warble generated by all video carriers, a test leak of the tagged channel can be created to listen to the warble it creates. With a little experience, it will be easy to distinguish the faster warble of most tagging systems.

If the leak is very large, or the person is very close to the source, for example, the bar graph has peaked all the way to the top, it may be necessary to reduce the gain of meter 10. In such case, by pressing function key F4, the gain is reduced by 20 dB. This occurs in input attenuator 14.

If the source is still uncertain, the channel can be changed to determine if the leak persists. Most cable leaks will be detectable on more than one channel.

It is noted from the above that meter 10 is sensitive to the video synchronizing pulses of television signals. If the tone and bar graph do not change when the video filter (elements 108–116) is switched on, this indicates that the measured signal contains these synchronizing pulses and is a television signal. If the tone and bar graph disappear when the video filter (elements 108–116) is activated, the measured signal does not contain synchronizing pulses, and therefore, the signal is not a television signal. This does not guarantee that there is no leak of the CATV system. It is possible for there to be both video and non-video signals present at the same time. If the non-video signal is larger that the CATV leak, it will mask the detection of the leak, just as a large CATV leak masks the detection of smaller leaks.

Meter 10 can be used for patrolling a CATV plant to locate leaks and meet FCC ride out requirements. However, once a leak has been located, measurements must be made from outside the vehicle.

Figure 6:
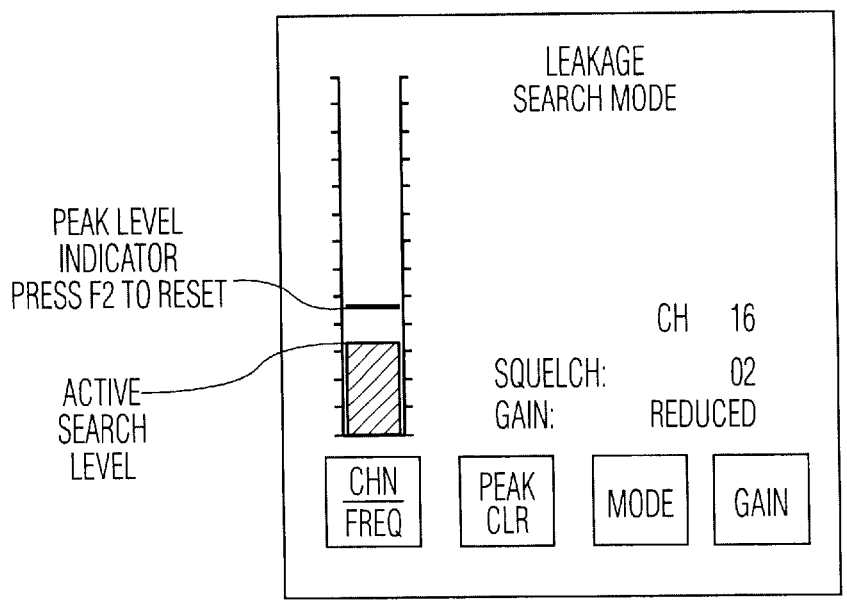
FIG. 6 is a sample reading from the display during the leakage search mode.

A sample reading from display 64 during the leak search mode is shown in FIG. 6.

Once a leak is found, the leak can be measured with meter 10. The FCC requires that all leaks greater than 20 $\mu$V/m, at 3 meters, be documented and fixed in a reasonable amount of time. Additionally, all leaks greater than 50 $\mu$V/m, at 3 meters, are to be included in the annual ground based CLI calculation. As mentioned earlier, making correct leakage measurements can be tricky. Many factors affect the measurement, including the antenna type, frequency, distance from the leak, distance from the ground, reflections from other objects, and interference from other signals. Therefore, the FCC has prescribed the following measurement requirements: the measurement instrument must be able to detect leaks of 20 $\mu$V/m at 3 meters; the leak must be measured using a dipole antenna; and the measurement should be made 10 feet from the leak, 10 feet off the ground and at least 10 feet from any other conductors.

To measure a leak using meter 10, a person tunes meter 10 to the video carrier of a channel between 108 and 140 MHz, and attaches a dipole antenna of a correct length for the chosen frequency. The leakage measurement mode is then selected by pressing F3. It is then verified that 10 feet has been selected as a distance factor, and a non-conducting, telescoping mast is extended to 10 feet. The dipole antenna is then oriented so that it is parallel to the leak, and the antenna is rotated to achieve the highest, peak level. Using the audio pitch at speaker 42 and peak hold on display 64 as aids, the leak level is recorded manually or using the meter save function with save key SAVE.

Figure 7:
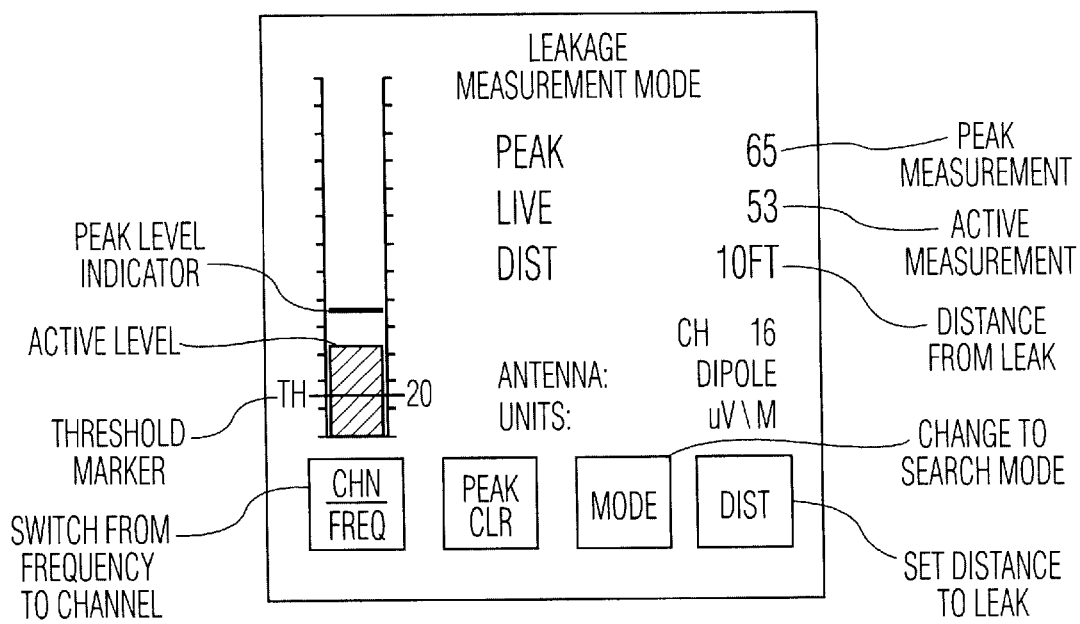
FIG. 7 is a sample reading from the display during the leakage measurement mode.

A sample reading from display 64 during the leak measurement mode is shown in FIG. 7.

Having described a specific preferred embodiment of the invention with reference to the accompanying drawings, it will be appreciated that the present invention is not limited to that precise embodiment and that various changes and modifications can be effected therein by one of ordinary skill in the art without departing from the scope or spirit of the invention defined by the appended claims.

What is claimed is:

1. A leakage detector comprising:
    a receiver front end having an input for connection with an antenna and a signal path connected to the input and including circuitry for passing a signal from the input without amplification;
    an intermediate frequency (IF) stage connected with the receiver front end for producing an intermediate frequency signal from the signal from said signal path;
    a detector having an input for producing an amplitude modulation (AM) detected output signal in response to the intermediate frequency signal;
    a leak processor having an input connected to the detector and including circuitry which passes only a synchronizing signal of the AM detected output signal, along with harmonic frequencies of the synchronizing signal and DC signals, said synchronizing signal having a peak level, and said signal processor providing an output signal corresponding to the peak level of the synchronizing signal of the AM detected output signal;
    a display; and
    a processing unit connected with the leak processor and the display for displaying leakage data in response to the output signal from the leak processor.

2. A leakage detector according to claim 1, wherein the leak processor includes:
    a filter having an input connected with the detector for removing AC noise from the AM detected output signal which is not in frequency coherence with the synchronizing signal, and for producing a filtered AM detected output signal;
    a first peak detector having an input connected with the detector for receiving the AM detected output signal therefrom and producing a first peak detected output signal;
    a second peak detector having an input connected with the filter for receiving the filtered AM detected output signal therefrom and producing a second peak detected output signal; and
    a noise power subtraction circuit having inputs connected with the first and second peak detectors for subtracting a DC level equivalent to noise power from the filtered AM detected output signal in response to the first and second peak detected output signals, to provide said output signal corresponding to leakage.

3. A leakage detector according to claim 2, wherein the noise power subtraction circuit includes:
    a first difference circuit having a first input connected with said first peak detector and a second input connected with said second peak detector, and which produces an output error signal in response to a difference between said first and second peak detected output signals; and
    a second difference circuit having a first input connected with said first difference circuit and a second input connected with said second peak detector, and which produces said output signal corresponding to leakage in response to a difference between said first and second peak detected output signals.

4. A leakage detector according to claim 2, wherein the leak processor further includes an equalization circuit connected between the filter and the second peak detector for compensating for a reduction in signal level of the filtered AM detected output signal from the filter.

5. A leakage detector according to claim 2, wherein the synchronizing signal is a horizontal synchronizing signal, and the filter includes an N-path filter clocked at a multiple rate corresponding to a sweep rate of the horizontal synchronizing signal.

6. A leakage detector according to claim 1, wherein said leak processor further comprises:
    a gate circuit; and
    a gate control circuit having an output connected with an input of said gate circuit, and which controls the gate circuit to pass the output signal corresponding to leakage to the processing unit only when said AM detected output signal includes a video modulated carrier component.

7. A leakage detector according to claim 6, wherein said gate control circuit includes:
    a filter which only passes a portion of said AM detected output signal at a frequency of said synchronizing signal;
    a detector having an input connected with said filter, and which detects the presence of an output signal from said filter to produce a control signal; and
    a gate drive circuit having an input connected with said detector and an output connected with said gate circuit, for controlling the gate circuit to pass the output signal corresponding to leakage to the processing unit only when said AM detected output signal includes the video modulated carrier component.

8. A leakage detector according to claim 1, further comprising:
    a speaker for producing an audio output; and
    an audio circuit for supplying a signal related to said output signal corresponding to leakage to said speaker.

9. A leakage detector according to claim 8, wherein said leak processor includes a voltage controlled oscillator (VCO) driven by said output signal from said leak processor and which supplies a signal to said audio circuit such that said speaker produces an audio feedback tone having a pitch that increases with increasing level of said output signal corresponding to leakage and decreases with decreasing level of said output signal corresponding to leakage.

10. A leakage detector according to claim 9, wherein said processing unit disables said VCO when said output signal corresponding to leakage is below a threshold level.

11. A leakage detector according to claim 9, wherein said pitch of the audio feedback tone will vary with leakage intensity and said leakage intensity will vary with orientation of the antenna relative to, and distance of the antenna from, said leakage.

12. A combination signal level meter and leakage detector, comprising:
    a single receiver front end having an input for connection with an antenna or a cable for a CATV signal to receive a signal therefrom, and a single signal path for acting on the signal from said input in the same manner, regardless of whether the signal is from the antenna or the cable,
    an intermediate frequency (IF) stage connected with the receiver front end for producing an intermediate frequency signal;
    a detector having an input for producing an amplitude modulation (AM) detected output signal in response to the intermediate frequency signal;

a leak processor having an input connected to the detector and operative in a leakage mode only when the antenna is connected with said single receiver front end, the leak processor including circuitry which passes only a synchronizing signal of the AM detected output signal, along with harmonic frequencies of the synchronizing signal and DC signals, said synchronizing signal having a peak level, and said signal processor providing an output signal corresponding to the peak level of the synchronizing signal of the AM detected output signal;

at least one signal detector for detecting characteristics of the CATV signal during a signal level meter mode, when the cable is connected with said single receiver front end;

a display; and a processing unit connected with the leak processor, the at least one signal detector, and the display for displaying leakage data in response to the output signal from the leak processor during the leakage mode and for displaying said characteristics of the CATV signal during the signal level meter mode.

13. A combination signal level meter and leakage detector according to claim 12, wherein the leak processor includes:

a filter having an input connected with the detector for removing AC noise from the AM detected output signal which is not in frequency coherence with the synchronizing signal, and for producing a filtered AM detected output signal;

a first peak detector having an input connected with the detector for receiving the AM detected output signal therefrom and producing a first peak detected output signal;

a second peak detector having an input connected with the filter for receiving the filtered AM detected output signal therefrom and producing a second peak detected output signal; and a noise power subtraction circuit having inputs connected with the first and second peak detectors for subtracting a DC level equivalent to noise power from the filtered AM detected output signal in response to the first and second peak detected output signals, to provide said output signal corresponding to leakage.

14. A combination signal level meter and leakage detector according to claim 13, wherein the noise power subtraction circuit includes:

a first difference circuit having a first input connected with said first peak detector and a second input connected with said second peak detector, and which produces an output error signal in response to a difference between said first and second peak detected output signals; and a second difference circuit having a first input connected with said first difference circuit and a second input connected with said second peak detector, and which produces said output signal corresponding to leakage in response to a difference between said first and second peak detected output signals.

15. A combination signal level meter and leakage detector according to claim 13, wherein the leak processor further includes an equalization circuit connected between the filter and the second peak detector for compensating for a reduction in signal level of the filtered AM detected output signal from the filter.

16. A combination signal level meter and leakage detector according to claim 13, wherein the synchronizing signal is a horizontal synchronizing signal, and the filter includes an N-path filter clocked at a multiple rate corresponding to a sweep rate of the horizontal synchronizing signal.

17. A combination signal level meter and leakage detector, according to claim 12, wherein said leak processor further comprises:

a gate circuit; and a gate control circuit having an output connected with an input of said gate circuit, and which controls the gate circuit to pass the output signal corresponding to leakage to the processing unit only when said AM detected output signal includes a video modulated carrier component.

18. A combination signal level meter and leakage detector according to claim 17, wherein said gate control circuit includes:

a filter which only passes a portion of said AM detected output signal at a frequency of said synchronizing signal;

a detector having an input connected with said filter, and which detects the presence of an output signal from said filter to produce a control signal; and a gate drive circuit having an input connected with said detector and an output connected with said gate circuit, for controlling the gate circuit to pass the output signal corresponding to leakage to the processing unit only when said AM detected output signal includes the video modulated carrier component.

19. A combination signal level meter and leakage detector according to claim 12, further comprising:

a speaker for producing an audio output; and an audio circuit for supplying said output signal corresponding to leakage to said speaker.

20. A combination signal level meter and leakage detector according to claim 19, wherein said leak processor includes a voltage controlled oscillator (VCO) driven by said output signal from said leak processor and which supplies a signal to said audio circuit such that said speaker produces an audio feedback tone having a pitch that increases with increasing level of said output signal corresponding to leakage and decreases with decreasing level of said output signal corresponding to leakage.

21. A leakage detector according to claim 20, wherein said processing unit disables said VCO when said output signal corresponding to leakage is below a threshold level.

22. A leakage detector according to claim 20, wherein said pitch of the audio feedback tone will vary with leakage intensity and said leakage intensity will vary with orientation of the antenna relative to, and distance of the antenna from, said leakage.

23. A combination signal level meter and leakage detector according to claim 12, wherein said at least one signal detector includes at least one of a peak detector, an average detector and a hum detector.

24. A combination signal level meter and leakage detector according to claim 12, wherein said single receiver front end is a wideband dual-conversion receiver front end.

25. A combination signal level meter and leakage detector according to claim 12, wherein said IF stage maintains an IF bandwidth of 280 KHz for both the leakage mode and the signal level meter mode.

26. A combination signal level meter and leakage detector according to claim 12, wherein said single receiver front end includes:

a first heterodyne mixer which converts an input signal thereto to a first intermediate frequency signal; and a second heterodyne mixer which converts said first intermediate frequency signal to a second intermediate frequency signal which is supplied to said detector.

27. A combination signal level meter and leakage detector according to claim 12, wherein said detector further produces a detected frequency modulation (FM) output signal, and further comprising:

a speaker for producing an audio output; and an audio amplifier for supplying said detected FM output signal to said speaker.

28. A combination signal level meter and leakage detector, according to claim 27, further comprising a mute circuit connected between said detector and said audio amplifier for preventing passage of said detected FM output signal to said audio amplifier during the leakage mode.

29. A combination signal level meter and leakage detector, according to claim 12, wherein the receiver front end includes a signal path connected to the input and including circuitry for passing a signal from the input without amplification.

30. A leakage detector comprising:

a receiver front end having an input for connection with an antenna;

an intermediate frequency (IF) stage connected with the receiver front end for producing an intermediate frequency signal from said first output signal;

a detector having an input for producing an amplitude modulation (AM) detected output signal in response to the intermediate frequency signal;

a leak processor having an input connected to the detector and including circuitry which passes only a synchronizing signal of the AM detected output signal, along with harmonic frequencies of the synchronizing signal and DC signals, said synchronizing signal having a peak level, and said signal processor providing an output signal corresponding to the peak level of the synchronizing signal of the AM detected output signal;

a display; and a processing unit connected with the leak processor and the display for displaying leakage data in response to the output signal from the leak processor.

31. A leakage detector according to claim 30, wherein the leak processor includes:

a filter having an input connected with the detector for removing AC noise from the AM detected output signal which is not in frequency coherence with the synchronizing signal, and for producing a filtered AM detected output signal;

a first peak detector having an input connected with the detector for receiving the AM detected output signal therefrom and producing a first peak detected output signal;

a second peak detector having an input connected with the filter for receiving the filtered AM detected output signal therefrom and producing a second peak detected output signal; and a noise power subtraction circuit having inputs connected with the first and second peak detectors for subtracting a DC level equivalent to noise power from the filtered AM detected output signal in response to the first and second peak detected output signals, to provide said output signal corresponding to leakage.

32. A leakage detector according to claim 31, wherein the noise power subtraction circuit includes:

a first difference circuit having a first input connected with said first peak detector and a second input connected with said second peak detector, and which produces an output error signal in response to a difference between said first and second peak detected output signals; and a second difference circuit having a first input connected with said first difference circuit and a second input connected with said second peak detector, and which produces said output signal corresponding to leakage in response to a difference between said first and second peak detected output signals.

33. A leakage detector according to claim 31, wherein the leak processor further includes an equalization circuit connected between the filter and the second peak detector for compensating for a reduction in signal level of the filtered AM detected output signal from the filter.

34. A leakage detector according to claim 31, wherein the synchronizing signal is a horizontal synchronizing signal, and the filter includes an N-path filter clocked at a multiple rate corresponding to a sweep rate of the horizontal synchronizing signal.

35. A leakage detector according to claim 30, wherein said leak processor further comprises:

a gate circuit; and a gate control circuit having an output connected with an input of said gate circuit, and which controls the gate circuit to pass the output signal corresponding to leakage to the processing unit only when said AM detected output signal includes a video modulated carrier component.

36. A leakage detector according to claim 35, wherein said gate control circuit includes:

a filter which only passes a portion of said AM detected output signal at a frequency of said synchronizing signal;

a detector having an input connected with said filter, and which detects the presence of an output signal from said filter to produce a control signal; and a gate drive circuit having an input connected with said detector and an output connected with said gate circuit, for controlling the gate circuit to pass the output signal corresponding to leakage to the processing unit only when said AM detected output signal includes the video modulated carrier component.

37. A leakage detector according to claim 30, further comprising:

a speaker for producing an audio output; and an audio circuit for supplying a signal related to said output signal corresponding to leakage to said speaker.

38. A leakage detector according to claim 37, wherein said leak processor includes a voltage controlled oscillator (VCO) driven by said output signal from said leak processor and which supplies a signal to said audio circuit such that said speaker produces an audio feedback tone having a pitch that increases with increasing level of said output signal corresponding to leakage and decreases with decreasing level of said output signal corresponding to leakage.

39. A leakage detector according to claim 38, wherein said processing unit disables said VCO when said output signal corresponding to leakage is below a threshold level.

40. A leakage detector according to claim 38, wherein said pitch of the audio feedback tone will vary with leakage intensity and said leakage intensity will vary with orientation of the antenna relative to, and distance of the antenna from, said leakage.

* * * * *